United States Patent
Miyajima et al.

(10) Patent No.: US 8,141,009 B2
(45) Date of Patent: Mar. 20, 2012

(54) PREPARING DATA FOR HYBRID EXPOSURE USING BOTH ELECTRON BEAM EXPOSURE AND RETICLE EXPOSURE IN LITHOGRAPHIC PROCESS

(75) Inventors: Masaaki Miyajima, Kasugai (JP); Hiromi Hoshino, Kawasaki (JP); Hiroshi Takita, Kawasaki (JP); Kozo Ogino, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 435 days.

(21) Appl. No.: 12/398,664

(22) Filed: Mar. 5, 2009

(65) Prior Publication Data
US 2009/0239160 A1 Sep. 24, 2009

(30) Foreign Application Priority Data
Mar. 18, 2008 (JP) ................................ 2008-069942

(51) Int. Cl.
*G06F 17/50* (2006.01)

(52) U.S. Cl. ................. 716/55; 716/52; 430/5; 438/795

(58) Field of Classification Search .................... 716/52, 716/55; 430/5; 438/795
See application file for complete search history.

(56) References Cited

U.S. PATENT DOCUMENTS

| | | | | |
|---|---|---|---|---|
| 5,991,006 | A * | 11/1999 | Tsudaka | 355/53 |
| 6,027,841 | A * | 2/2000 | Suzuki | 430/30 |
| 6,087,052 | A * | 7/2000 | Manabe et al. | 430/30 |
| 6,337,162 | B1 * | 1/2002 | Irie | 430/5 |
| 6,546,543 | B1 * | 4/2003 | Manabe et al. | 716/52 |
| 6,605,397 | B2 | 8/2003 | Narihiro | |
| 6,741,732 | B2 * | 5/2004 | Yui | 382/144 |
| 2003/0198872 | A1 * | 10/2003 | Yamazoe et al. | 430/5 |
| 2005/0053273 | A1 * | 3/2005 | Ostrom et al. | 382/151 |
| 2007/0177132 | A1 * | 8/2007 | Smith | 356/124 |
| 2007/0279607 | A1 * | 12/2007 | Smith et al. | 355/52 |

FOREIGN PATENT DOCUMENTS

| | | |
|---|---|---|
| JP | 03-054817 | 3/1991 |
| JP | 04-026109 | 1/1992 |
| JP | 2001-109128 A | 4/2001 |
| JP | 2001-189259 A | 7/2001 |
| JP | 2001-330940 A | 11/2001 |

* cited by examiner

*Primary Examiner* — Naum Levin
(74) *Attorney, Agent, or Firm* — Arent Fox LLP

(57) ABSTRACT

A method for preparing data for exposure includes forming a first plurality of rectangular patterns from a reticle preparing rule; lining an object pattern for performing reticle exposure with the first rectangular patterns, and extracting a second plurality of rectangular patterns, disposed in an N×N matrix, from the first plurality of rectangular patterns in the object pattern; and performing a violation detecting treatment and a correcting treatment of the pattern width and the pattern distance of the reticle exposure pattern on the basis of the distance between the second plurality of rectangular patterns.

9 Claims, 21 Drawing Sheets

$w = s \times N + da \times (N-1)$
N : NUMBER OF DISPOSED PATTERNS

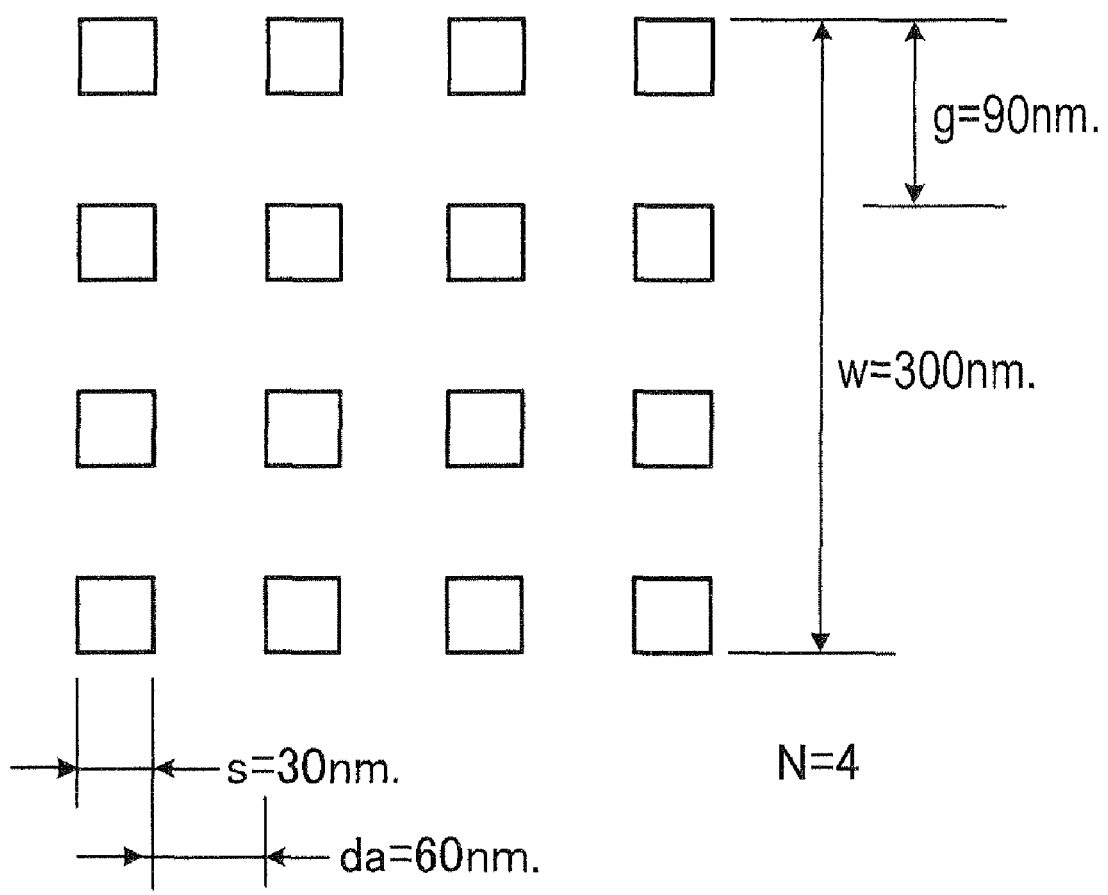

PREPARING DATA FOR HYBRID EXPOSURE USING BOTH ELECTRON BEAM EXPOSURE AND RETICLE EXPOSURE IN LITHOGRAPHIC PROCESS

CROSS-REFERENCE TO RELATED APPLICATION

This application is based upon and claims the benefit of priority from the prior Japanese Patent Application No. 2008-69942 filed on Mar. 18, 2008, the entire contents of which are incorporated herein by reference.

BACKGROUND

1. Field

Aspects in accordance with the present invention relate to a method for preparing data for hybrid exposure used in lithographic process using both electron beam exposure and reticle exposure in a process for manufacturing a semiconductor integrated circuit.

2. Description of Related Art

Electron beam exposure (hereafter referred to as "EB exposure") can perform high-accuracy exposure and can eliminate costs for reticle preparation because no reticle is required. However, since a large amount of time is required for exposure treatment, the throughput of lithographic processing is lowered.

Therefore, hybrid exposure has been used, wherein exposure for patterns having large areas that do not require exposure accuracy (for example, dummy patterns) is performed by reticle exposure, and exposure for fine patterns that requires exposure accuracy is performed by EB exposure. Hybrid exposure improves the throughput on the exposure process, and also solves the problems caused during the EB exposure of patterns having large areas, such as out-of-focus beams.

However, due to the miniaturization of circuit patterns in semiconductor integrated circuit devices, high-accuracy reticle exposure has also been required. Specifically, a correcting treatment, such as an OPC treatment, which is an optical treatment for improving accuracy, wherein an ArF light source that enables high-accuracy exposure by light having a short wavelength is used as the light source for reticle exposure; a LFC treatment, which is a lens correcting treatment for improving accuracy; and a phase shifter treatment for correcting reduced accuracy caused by local flare, must be performed. Therefore, costs for reticle manufacturing have been significantly raised, and the advantage of performing hybrid exposure has been reduced.

The adoption of reticle using a KrF light source that outputs light having a long wavelength can save costs in reticle manufacturing. The reticle using a KrF light source does not require the above-described correcting treatment, such as an OPC treatment, a LFC treatment, and a phase shifter treatment, thus reducing reticle preparation man-power and costs for reticle manufacturing.

However, the reticle using a KrF light source cannot expose fine patterns with high accuracy, and cannot deal with fine exposure patterns, in recent years.

In Japanese Patent Laid-Open Nos. 2001-330940, 2001-109128, and 2001-189259, configurations for taking out reticle patterns using the resolution dimension of KrF exposure, or the resolution dimension of deep-UV as the reference. However, since reticle patterns are taken out by the above-described image processing, the time required for processing cannot be shortened.

Although Japanese Patent Laid-Open No. 3-54817 discloses a method for preparing patterns for performing hybrid exposure, means for solving the above-described problems have not yet been disclosed.

Although Japanese Patent Laid-Open No. 4-26109 discloses a method for preparing an image pattern for performing hybrid exposure, since the pattern is prepared by image processing accompanying change in parameter values or image processing procedures, the above-described problems have not yet been solved.

Although hybrid exposure by reticle exposure using KrF exposure and EB exposure requires no correcting treatment when reticle data is prepared by ArF exposure, it still has a problem wherein violation site detecting treatment to determine whether the design rule is satisfied or not and treatment to correct the violation site take a long time.

SUMMARY

According to aspects of an embodiment, a method for preparing data for exposure includes: forming a first plurality of rectangular patterns from a reticle preparing rule; lining an object pattern for performing reticle exposure with the first plurality of rectangular patterns, and extracting a second plurality of rectangular patterns disposed in an N×N matrix from the first plurality of rectangular patterns in the object pattern; and performing a violation detecting treatment and a correcting treatment of the pattern width and the pattern distance of the reticle exposure pattern on the basis of the distance between the second plurality of rectangular patterns.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 8 is an explanatory diagram illustrating an extracting treatment for rectangular patterns B;

DESCRIPTION OF EMBODIMENTS

Figure 20:
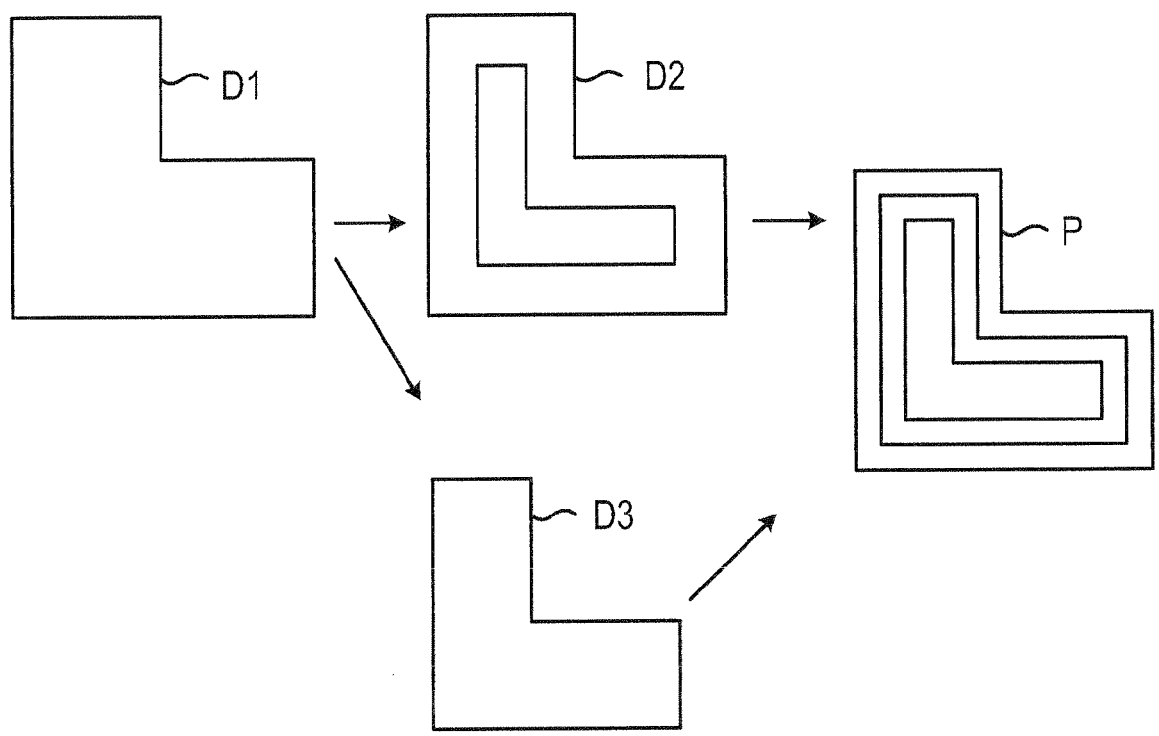
FIG. 20 is an explanatory diagram illustrating the concept of hybrid exposure.

Without being bound by theory, FIG. 20 shows the general configuration of data for hybrid exposure. Exposure data D1 is divided into data for EB exposure D2 and data for reticle exposure D3. The data for reticle exposure 33 is data to expose the center portion of the exposure data D1, and the data for EB exposure D2 is data to expose the periphery of the exposure data D1.

When EB exposure is performed by the data for EB exposure D2, and reticle exposure is performed by the data for reticle exposure D3, an exposure pattern P is exposed. Specifically, by reticle exposure using the data for reticle exposure D3, the center portion of the exposure pattern P is exposed at a low accuracy; and by EB exposure using the data for EB exposure D2, the peripheral portion of the exposure pattern P is exposed at a high accuracy.

Figure 21A:
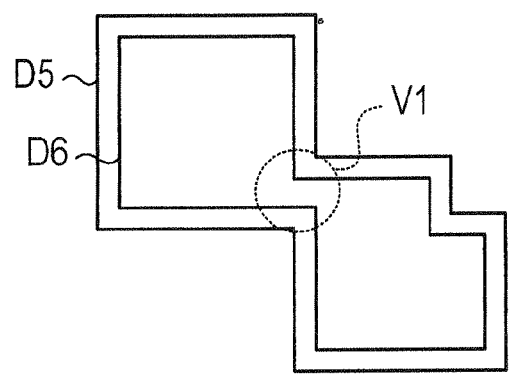
FIGS. 21A to 21D are explanatory diagrams illustrating conventional violation detecting treatment and the correcting treatment for reticle exposure data.
Figure 21B:
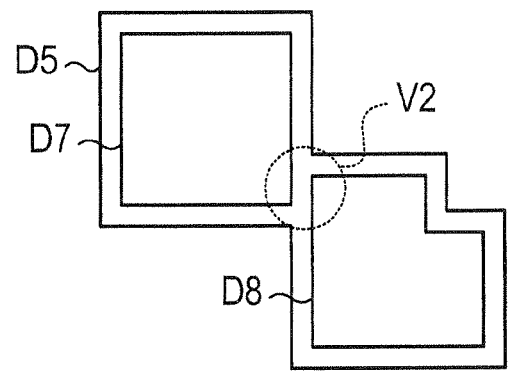

Without being bound by theory, FIGS. 21A to 21D show defects produced by low-accuracy reticle exposure using a KrF light source (KrF exposure). When data for reticle exposure D6 is prepared inside exposure data D5, whether or not the data D6 satisfies the design rule of the pattern for KrF exposure is judged. Then, as shown in FIG. 21A, when the violating portion V1 wherein the pattern width does not satisfy the reference value is produced in the data D6, as shown in FIG. 21B, the violating portion V1 is removed, and the data D6 is divided into data for reticle exposure D7 and D8.

Figure 21C:
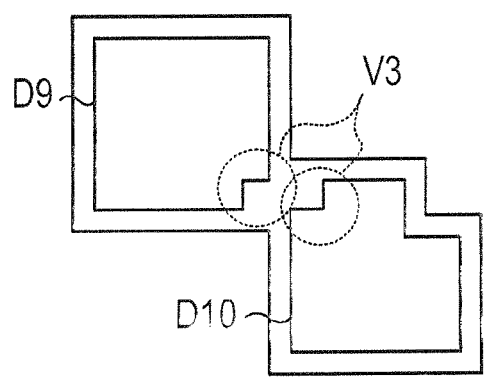

Then, a fine step wherein pattern distance does not satisfy the reference value is produced as a violation site V2 between data D7 and D8. Consequently, as shown in FIG. 21C, if treatment to enlarge the distance of the violation site V2 is performed to prepare data D9 and D10, a fine step that does not satisfy the reference value is produced as a violation site V3 in the data D9 and D10.

Figure 21D:
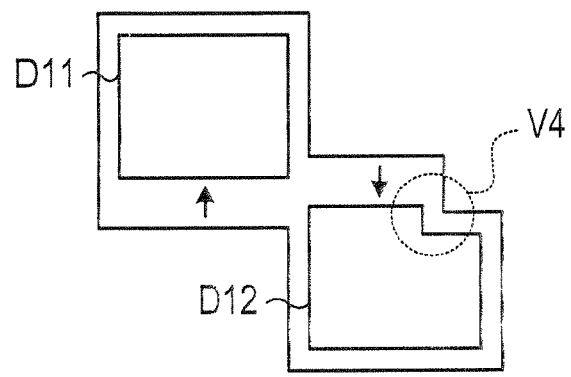

In order to remove the violation site V2 between data D7 and D8, if data D11 and D12 are prepared so as to separate the data D7 and D8 in the height direction, as shown in FIG. 21D, a fine step that does not satisfy the reference value is produced as a violation site V4 in the data D12.

Since the violation site detecting treatment and the data correcting treatment as described above are performed by image processing wherein the coordinate of each image data is compared with the reference value and the coordinate of the violation site is changed to satisfy the reference value, additional time is required for the correcting treatment. Then, any new violation site produced by the correcting treatment requires further time for treatment.

Hereafter, an embodiment in accordance with aspects of the present invention will be described referring to the drawings.

Figure 1:
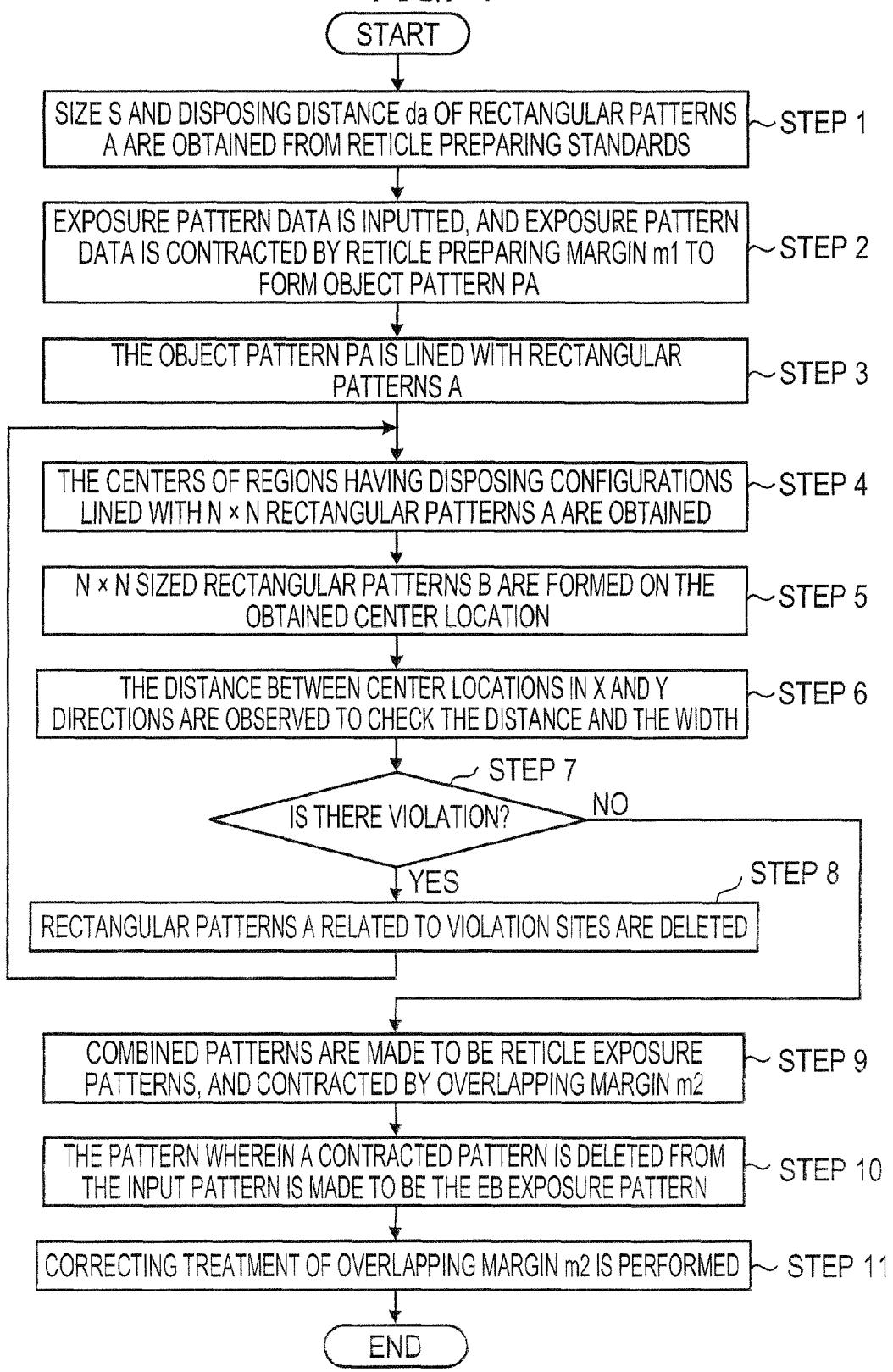
FIG. 1 is a flow chart showing a method for preparing data for hybrid exposure.

FIG. 1 is a flow chart showing procedures for preparing data for hybrid exposure according to aspects of the present embodiment. In Step 1, the size and the disposing distance of a plurality of square rectangular patterns A are obtained from the reticle preparing standards.

Figure 2:
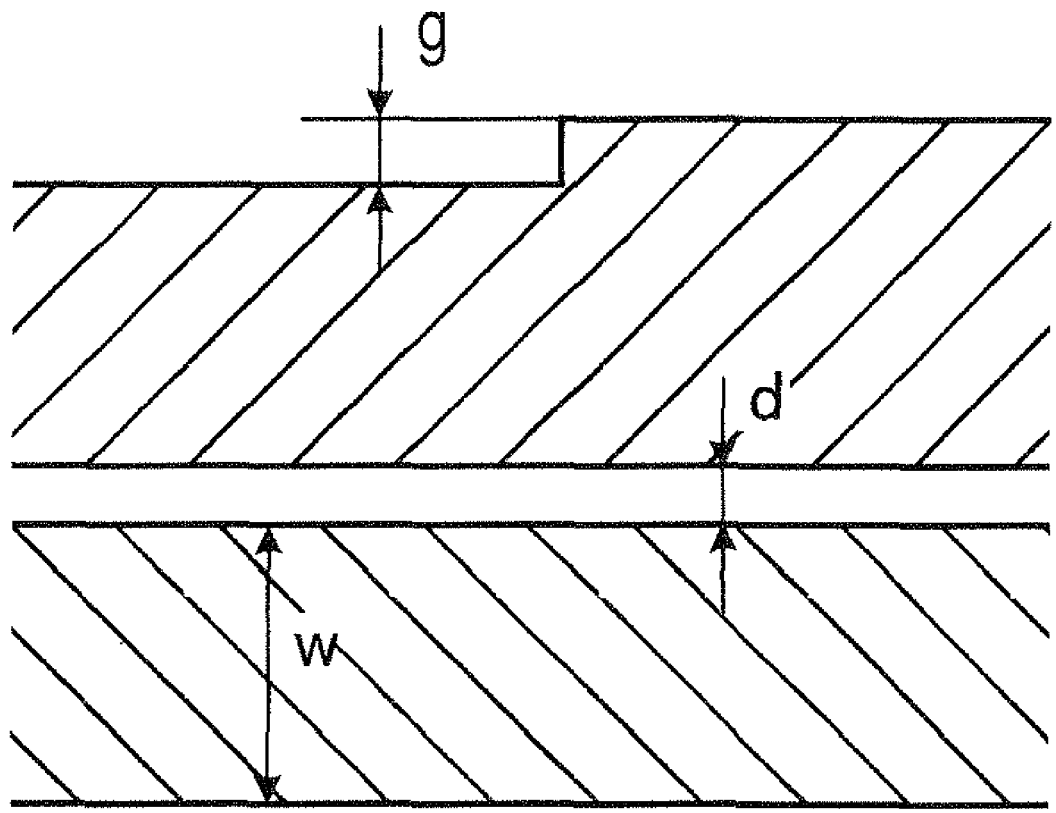
FIG. 2 is an explanatory diagram illustrating a reticle preparing rule.
Figure 3:
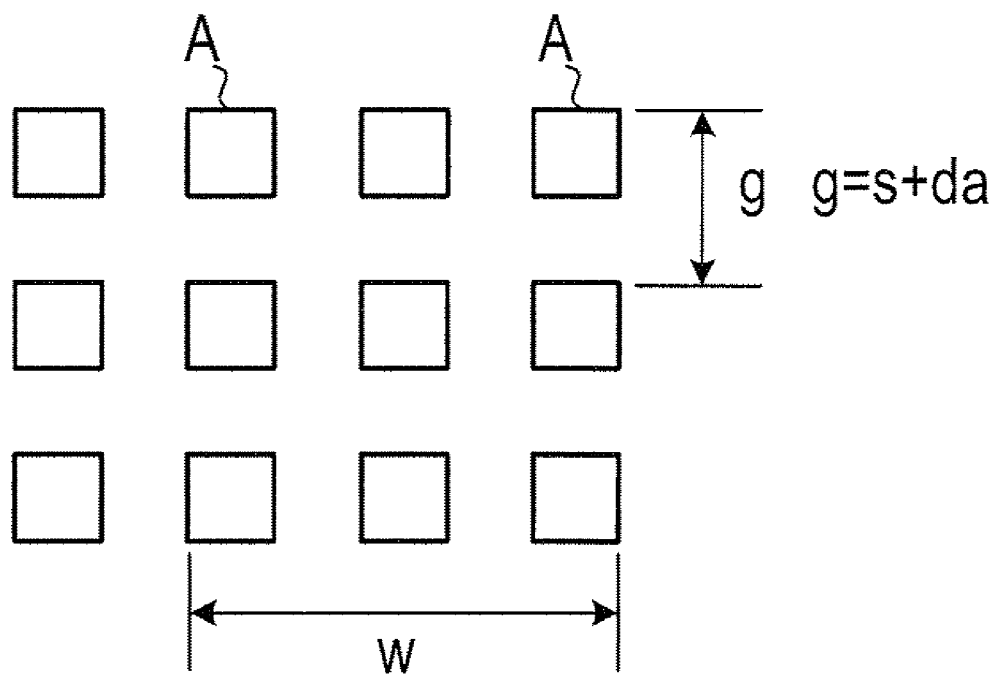
FIG. 3 is an explanatory diagram illustrating a method for preparing rectangular patterns A.

In the pattern data for reticle preparation, the minimum pattern width w, the minimum pattern distance d, and the minimum pattern step g shown in FIG. 2 are set up as the preparation rule. As shown in FIG. 3, the rectangular size s of the rectangular patterns A are made to be:

Minimum pattern step $g$=Rectangular size $s$+Disposing distance $da$

Minimum pattern width $w$=Rectangular size $s \times N$ + Disposing distance $da \times (N-1)$ where N is the number of rectangular patterns A obtained from Minimum pattern width w÷Minimum pattern step g, and when there is a remainder, N+1 is used.

Figure 4:
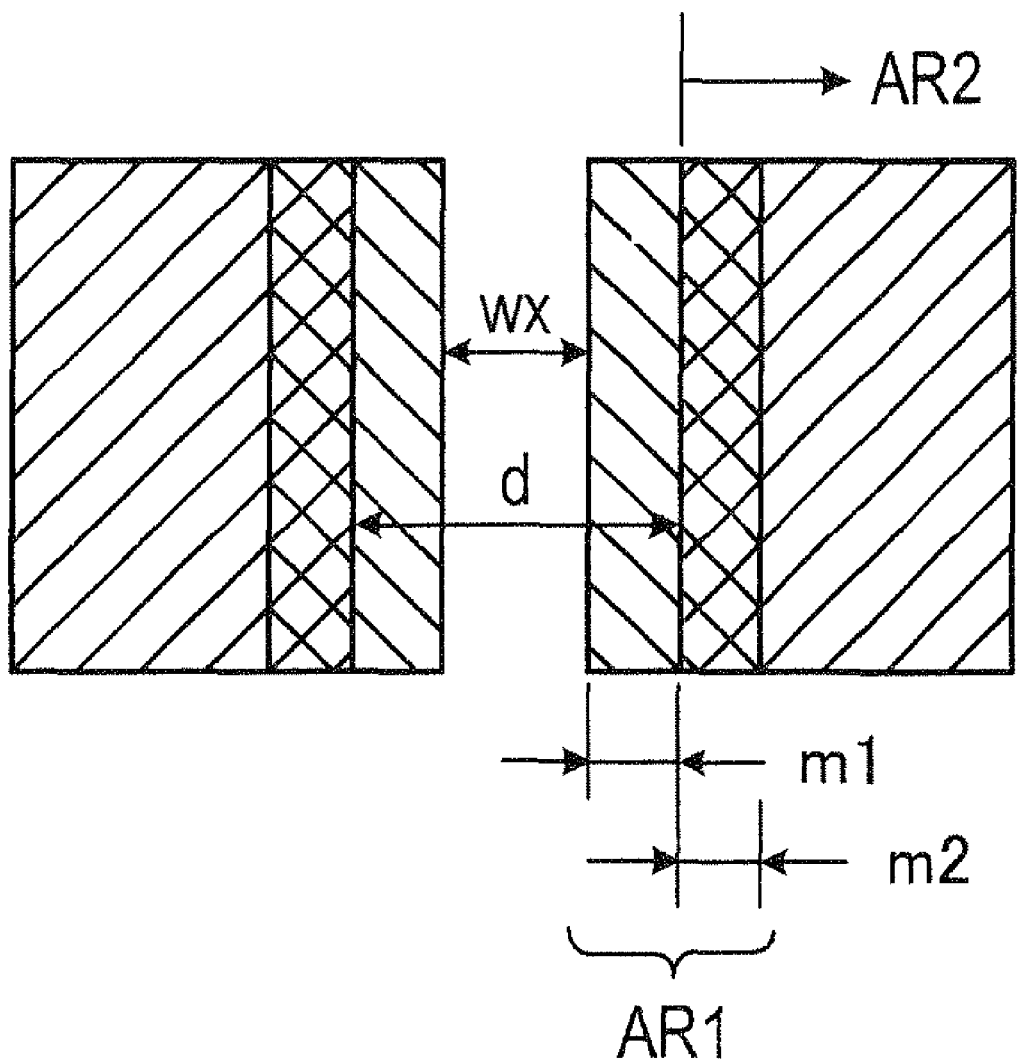
FIG. 4 is an explanatory diagram illustrating a reticle preparing rule.

The minimum pattern distance d is set up as a value obtained by adding a reticle preparation margin m1 to the minimum distance wx specified by the design rule of the exposure pattern as shown in FIG. 4, and can be optionally changed by adjusting the reticle preparation margin m1. The reticle preparation margin m1 is generally required for hybrid exposure, when reticle exposure and EB exposure are performed; the margin is set up so as to maintain the pattern of exposure within the margin even if displacement occurs in reticle exposure.

In FIG. 4, AR1 represents the EB exposure region, and AR2 inside AR1 represents the reticle exposure region. An overlapping margin m2 where the EB exposure region AR1 overlaps the reticle exposure region AR2 is set up.

Aspects of this embodiment will be described on the basis of these specific preparation rules. As shown in FIG. 8, when the minimum pattern width w is set up to be 300 nm and the minimum pattern step g is set up to be 90 nm, the rectangular size is 30 nm, the disposing distance da is 60 nm, and the disposing number N is 4 from the above equations.

Figure 5:
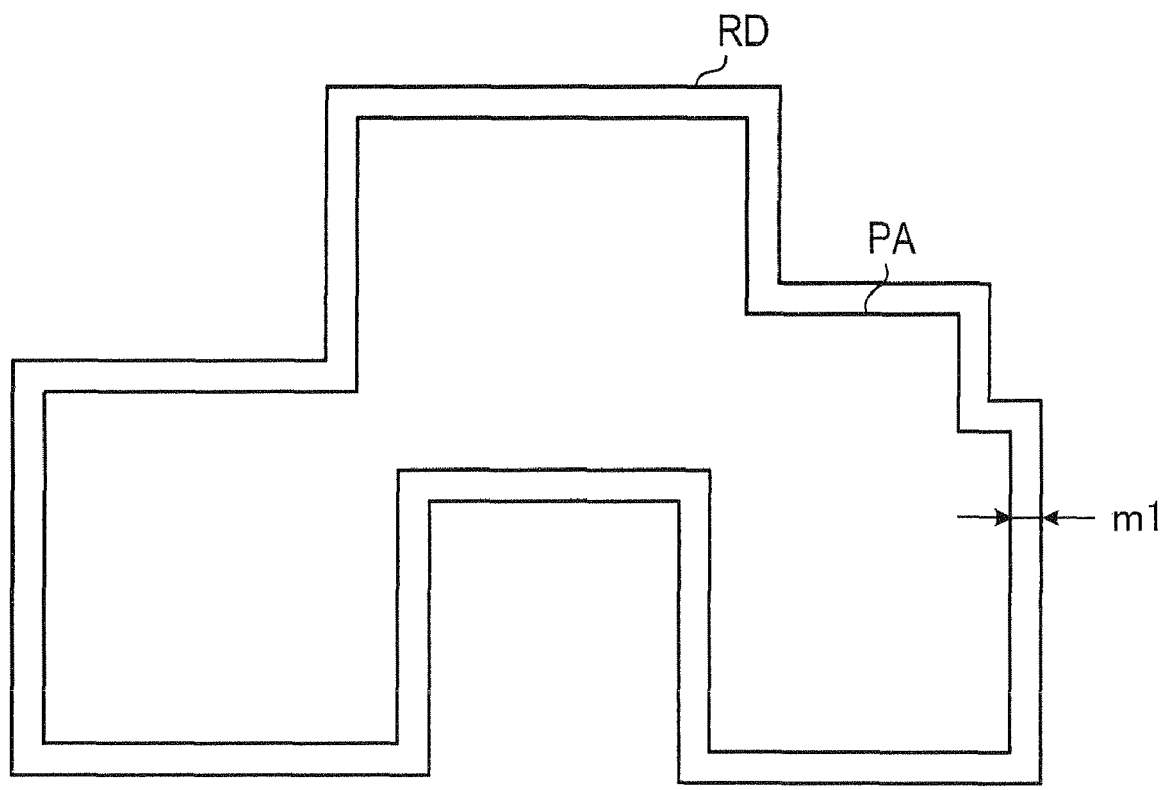
FIG. 5 is an explanatory diagram illustrating a method for preparing data for hybrid exposure.

Next, in Step 2, as shown in FIG. 5, exposure pattern data RD for performing hybrid exposure is retrieved as an input pattern, and the exposure pattern data RD is contracted by the reticle preparing margin m1 to prepare an object pattern PA. The object pattern PA is the region subjected to reticle exposure.

Figure 6:
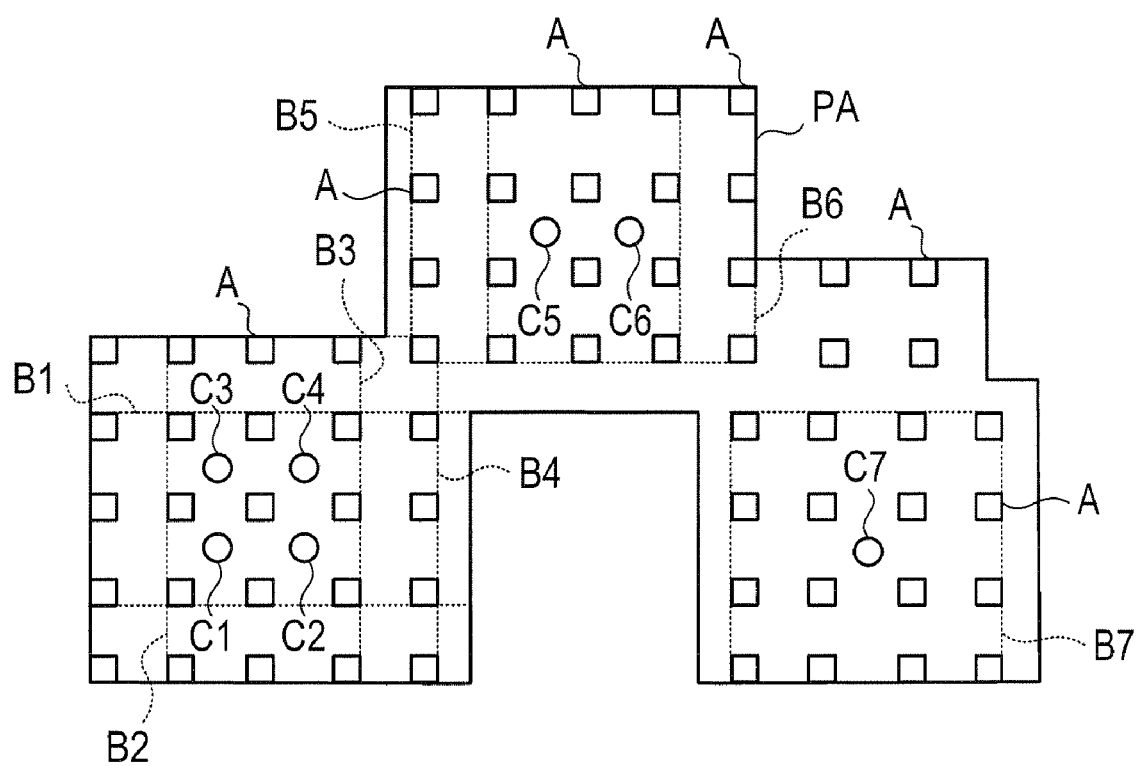
FIG. 6 is another explanatory diagram illustrating a method for preparing data for hybrid exposure.

Next, in Step 3, as shown in FIG. 6, the object pattern PA is lined with the rectangular patterns A calculated in Step 1.

Next, in Step 4, the centers of regions lined with N×N rectangular patterns A (illustrated as regions having 4×4 rectangular patterns) obtained. Each of these regions may be partially overlapped. Then in FIG. 6, centers c1 to c7 are obtained.

Next, in Step 5, the N×N regions corresponding to each of centers c1 to c7 are set up as rectangular patterns B1 to B7. Then, in Step 6, the presence of any violation to the minimum pattern width w and the minimum pattern distance d is detected on the basis of the X-Y coordinate of each of centers c1 to c7.

Here, the principle of detecting the presence of a violation to the minimum pattern width w and the minimum pattern distance d, and the principle of the correcting treatment will be described referring to FIG. 7.

Figure 7A:
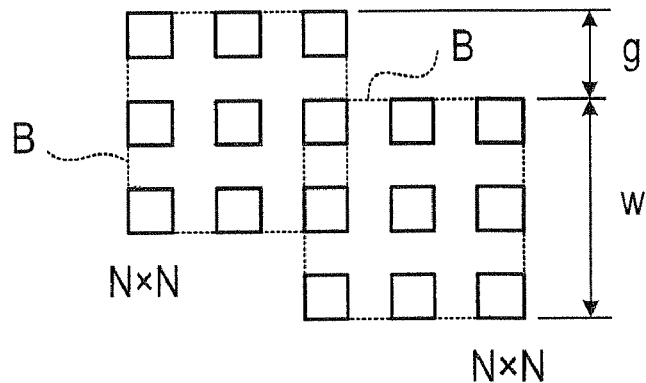
FIGS. 7A to 7C are explanatory diagrams illustrating a violation detecting treatment of a reticle exposure pattern.

As shown 4n FIG. 7A, the width of the rectangular pattern B is the minimum pattern width w, and the sum of the rectangular size s and the disposing distance da, (s+da), is the minimum pattern step g. Here, the rectangular pattern B is described in the case of N=3.

Figure 7B:
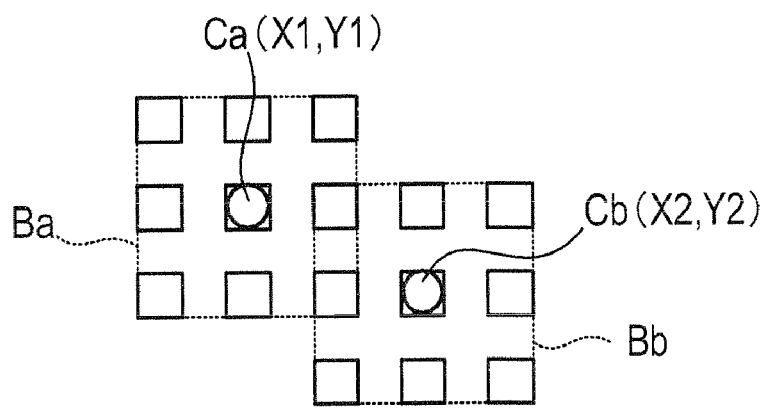
Figure 7C:
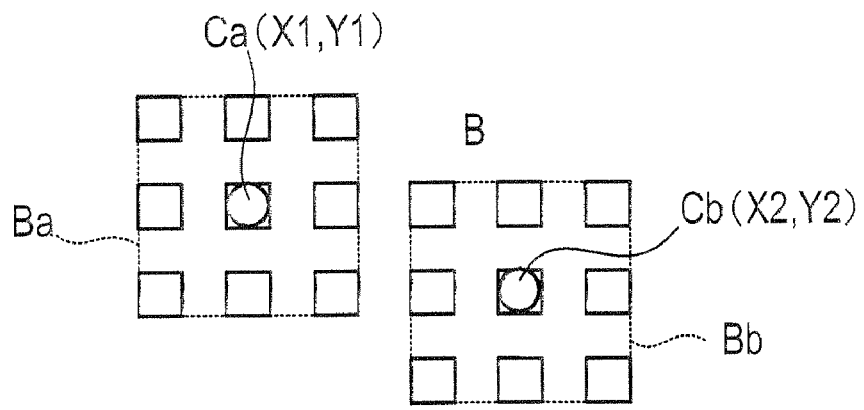

As shown in FIGS. 7B and 7C, when the X-Y coordinate of the rectangular pattern Ba is X1, Y1, and the X-Y coordinate of the rectangular pattern Bb is X2, Y2, the minimum pattern width w between the rectangular patterns Ba and Bb is violated under the following conditions. Specifically, as shown in FIG. 7B, when the value of |X1−X2| is the minimum pattern width w or less, and the value of |Y1−Y2| is the minimum pattern width w or less, the minimum pattern width w between rectangular patterns Ba and Bb has been violated. In this case, if either one of |X1−X2| or |Y1−Y2| is 0, the reticle exposure pattern is not violated.

As shown in FIG. 7C, when |X1−X2|−w is less than the minimum pattern distance d, and |Y1−Y2|−w is less than the minimum pattern distance d, the minimum pattern distance d between the rectangular patterns Ba and Bb are violated. In this case, the coordinate distance is made to be the minimum pattern width w or more. When the centers Ca and Cb of rectangular patterns Ba and Bb are located in the diagonal direction to X-axis and Y-axis, since the distance between the centers Ca and Cb is larger than the distances in the X-axis direction and Y-axis direction, any violations are judged with consideration for the increase in the distance.

When the sum of the rectangular size s and the disposing distance da is R, and N−|X2−X1|÷R is calculated, the number of rectangular patterns A in the X direction in the region of the rectangular patterns B that is in violation to the minimum pattern width w can be obtained.

Similarly, when the sum of the rectangular size s and the disposing distance da is R, and N−|Y2−Y1|÷R is calculated, the number of rectangular patterns A in the Y direction in the region of the rectangular patterns B that are in violation to the minimum pattern width w can be obtained.

Also when (|X2−X1|−w)÷R is calculated, the number of rectangular patterns A that violate the minimum pattern distance d in the region of the rectangular patterns B in the X direction can be obtained.

Similarly, when (|Y2−Y1|−w)÷R is calculated, the number of rectangular patterns A that violate the minimum pattern distance d in the region of the rectangular patterns B in the Y direction can be obtained.

When the direction between two center points Ca and Cb is considered, the violation of rectangular patterns A in rectangular patterns B can be specified.

Figure 9:
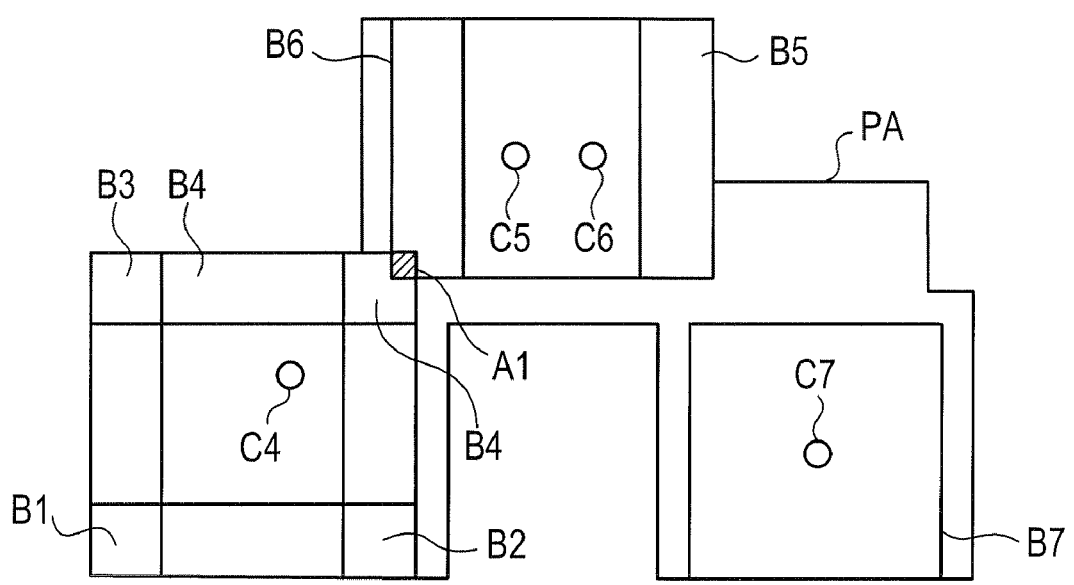
FIG. 9 is an explanatory diagram illustrating a method for preparing data for hybrid exposure.

On the basis of the violation detection principle for the minimum pattern width w and the minimum pattern distance d, the treatment of Step 6 is performed. Specifically, in FIG. 9, rectangular patterns A1 overlapping in rectangular patterns B4 and B6 are detected to be subjected to the minimum pattern width w. In the object pattern PA shown in FIG. 9, violation to the minimum pattern distance d is assumed not to occur.

Next, in Step 7, the presence of a violation is judged. If a violation is present, the rectangular patterns A related to the violation site are deleted. Therefore, in FIG. 9, since rectangular pattern A1 violates the rule, rectangular pattern A1 is deleted.

Figure 10:
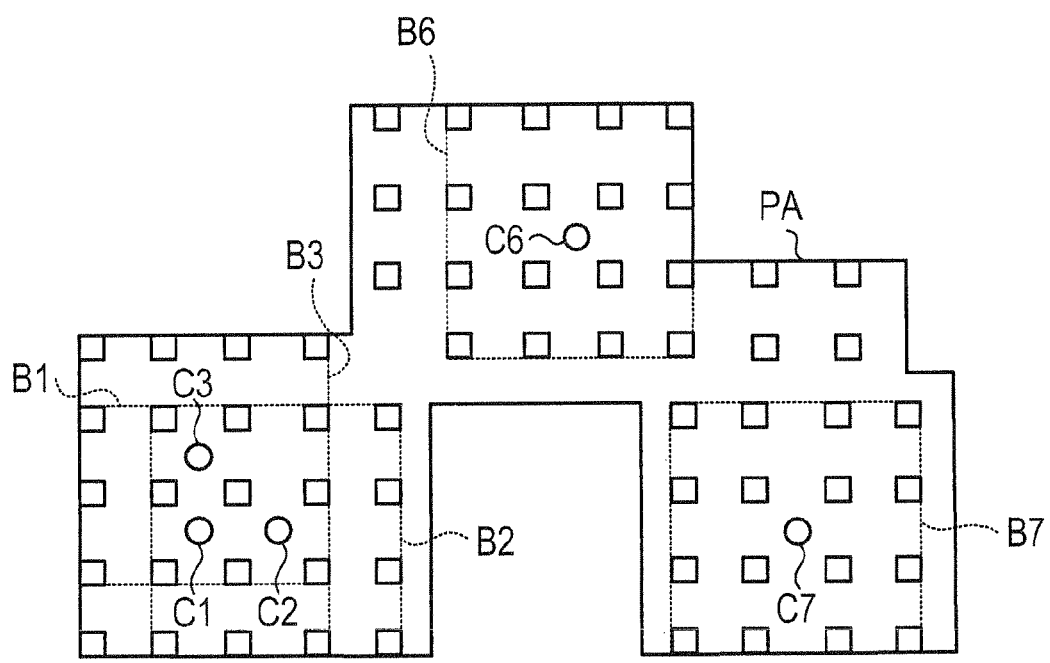
FIG. 10 is an explanatory diagram illustrating a method for preparing data for hybrid exposure.
Figure 11:
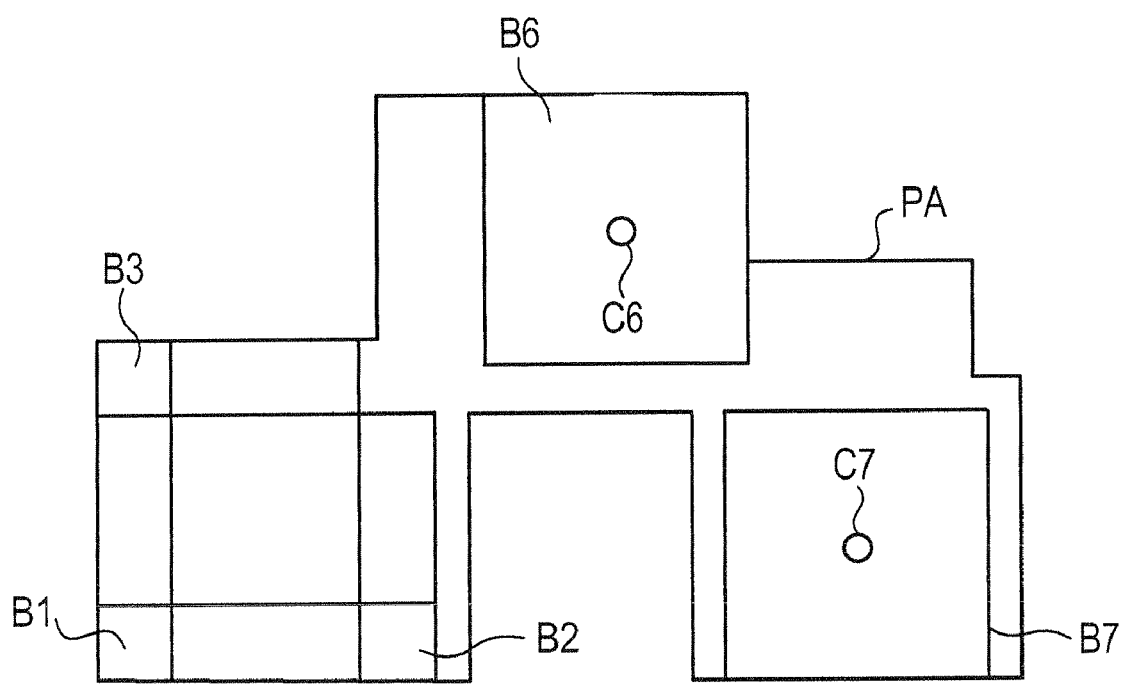
FIG. 11 is an explanatory diagram illustrating a method for preparing data for hybrid exposure.

Next, the treatments of Steps 4 and 5 are performed again. Then, as shown in FIGS. 10 and 11, centers C4 and C5 are deleted from the state shown in FIG. 6, and rectangular patterns B4 and B5 are deleted.

Figure 12:
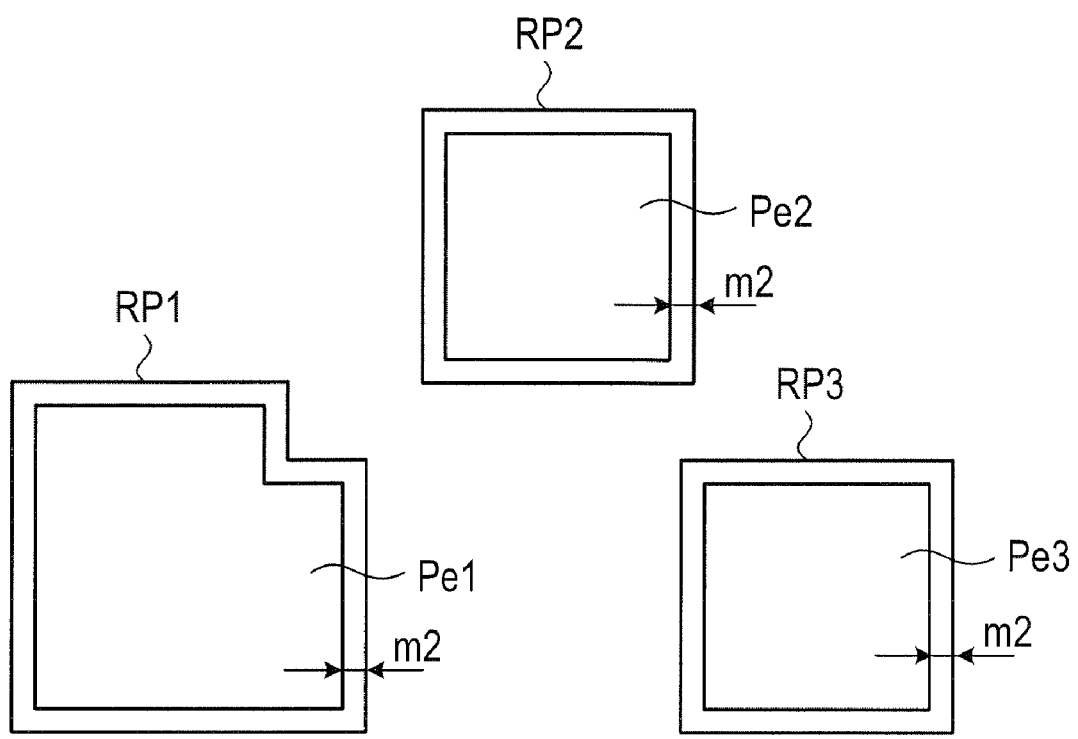
FIG. 12 is an explanatory diagram illustrating a method for preparing data for hybrid exposure.

Next, the treatment of Step 6 is performed again. Since no violation sites are found in FIG. 11, Steps 7 to are conducted. In Step 9, the rectangular patterns B1, B2, and B3 shown in FIG. 11 are combined to form a reticle exposure pattern RP1 shown in FIG. 12. A reticle exposure pattern RP2 is formed from the rectangular pattern B6, and a reticle exposure pattern RP3 is formed from the rectangular pattern B7. Then, each of the reticle exposure patterns RP1 to RP3 is contracted by the overlapping margin m2 with EB exposure to form patterns Pe1 to Pe3 for preparing EB exposure data.

Figure 13:
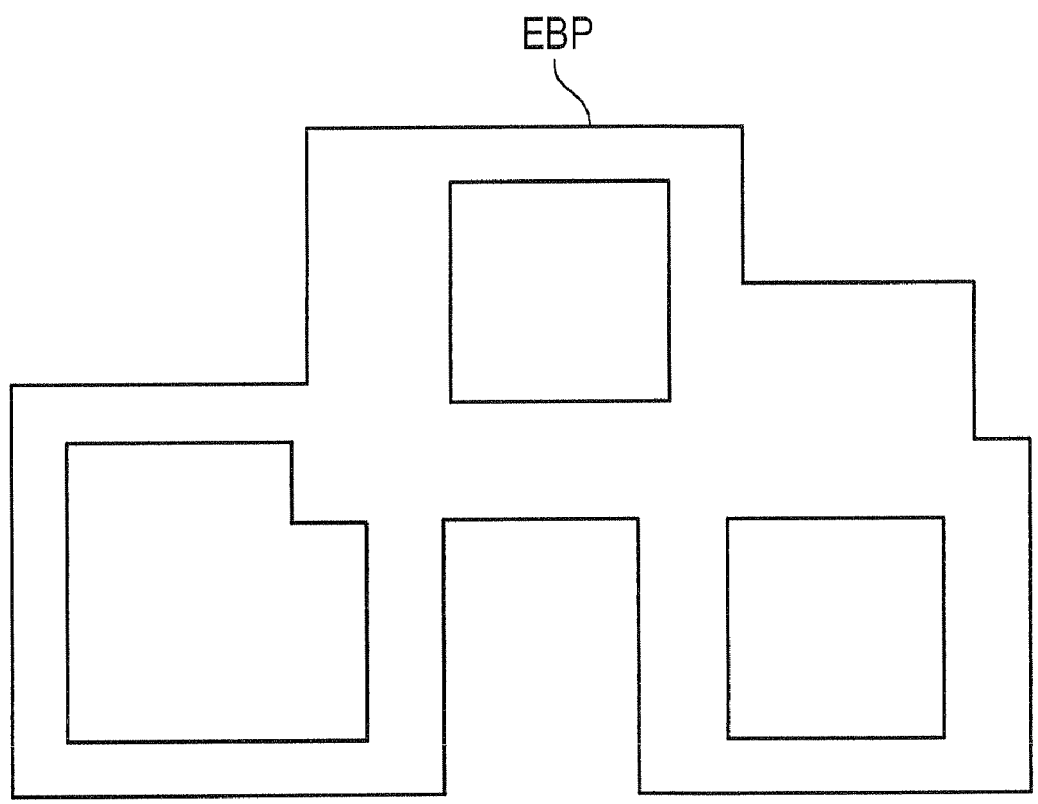
FIG. 13 is an explanatory diagram illustrating a method for preparing data for hybrid exposure.
Figure 14:
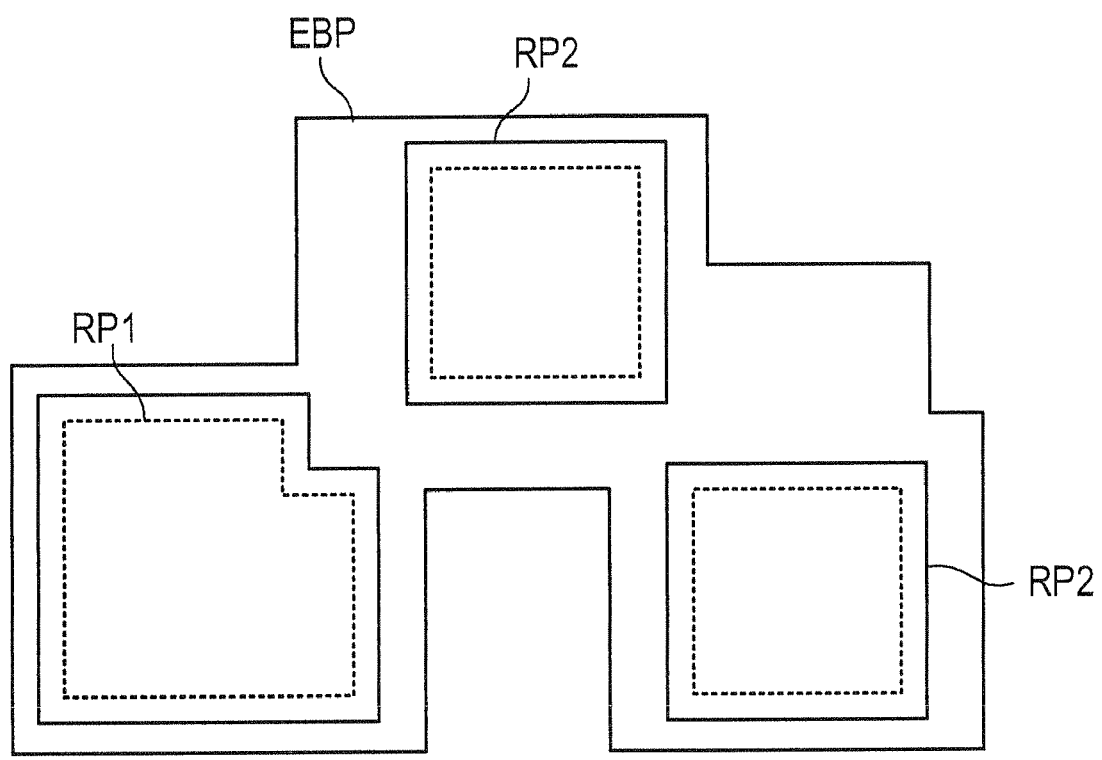
FIG. 14 is an explanatory diagram illustrating a method for preparing data for hybrid exposure.

Next, in Step 10, as shown in FIG. 13, the pattern wherein the patterns Pe1 to Pe3 for preparing EB exposure data are removed from the exposure pattern data RD is formed as EB exposure pattern EBP. Then, as shown in FIG. 14, from the exposure pattern data RD for hybrid exposure retrieved in Step 2, reticle exposure patterns RP1 to RP3 and the EB exposure pattern EBP are formed.

Figure 15A:
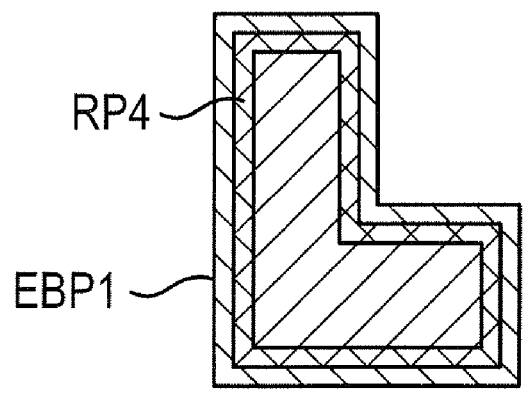
FIGS. 15A to 15C are explanatory diagrams illustrating cases when cover margin is insufficient in hybrid exposure.
Figure 15B:
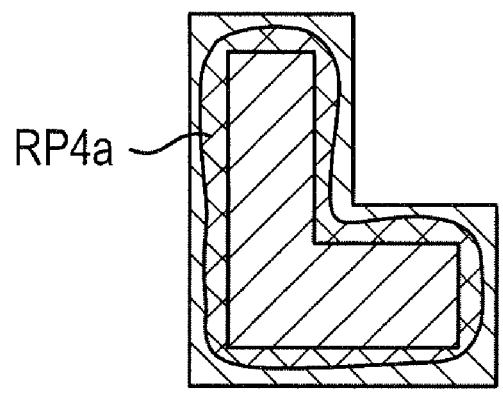
Figure 15C:
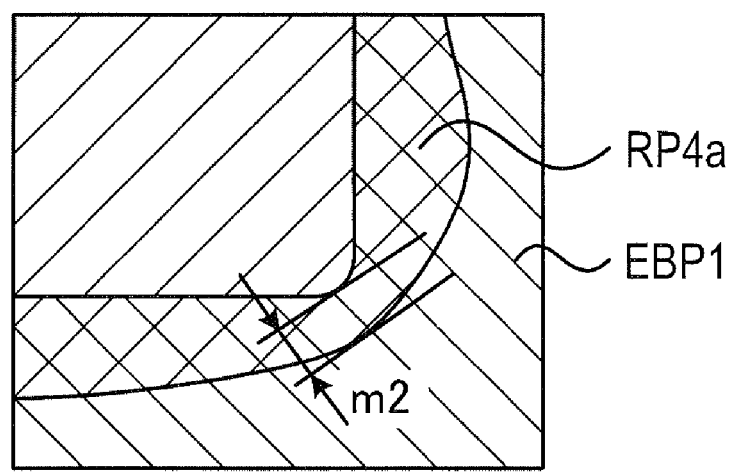

Next, in Step 11, the correcting treatment of overlapping margins m2 in the corner portions of reticle exposure patterns RP1 to RP3 are performed. For example, if hybrid exposure is performed using the reticle exposure pattern RP4 and the BB exposure pattern EBP1 as shown in FIG. 15A, the accuracy of reticle exposure is poor. Therefore, actually exposed pattern RP4a is rounded at the corner portion X in the convex direction of the reticle exposure pattern RP4 as shown in FIG. 15B. As a result, overlapping margins m2 may be insufficient as shown in FIG. 15C.

Figure 16A:
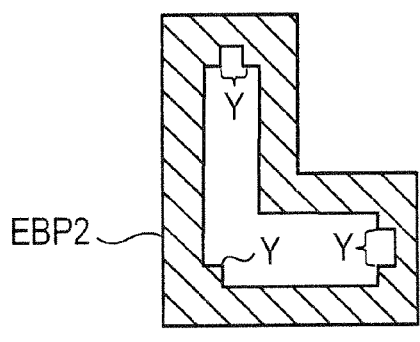
FIGS. 16A and 16B are explanatory diagrams illustrating the correcting treatment for EB exposure data.

Therefore, as shown in FIG. 16A, rectangular portions Y having a height of α are formed on the corner portions in the concave direction of the EB exposure pattern EBP1, specifically, the corner portions facing the corner portion X of the reticle exposure pattern RP4. The value of α is optionally determined so as to compensate the insufficiency of the overlapping margins m2.

By performing hybrid exposure using such a reticle exposure pattern EBP2, the overlapping margins m2 on the corner portions X of the reticle exposure pattern RP4 can be secured. Thus, the corner portions of the pattern can be accurately exposed.

Figure 17:
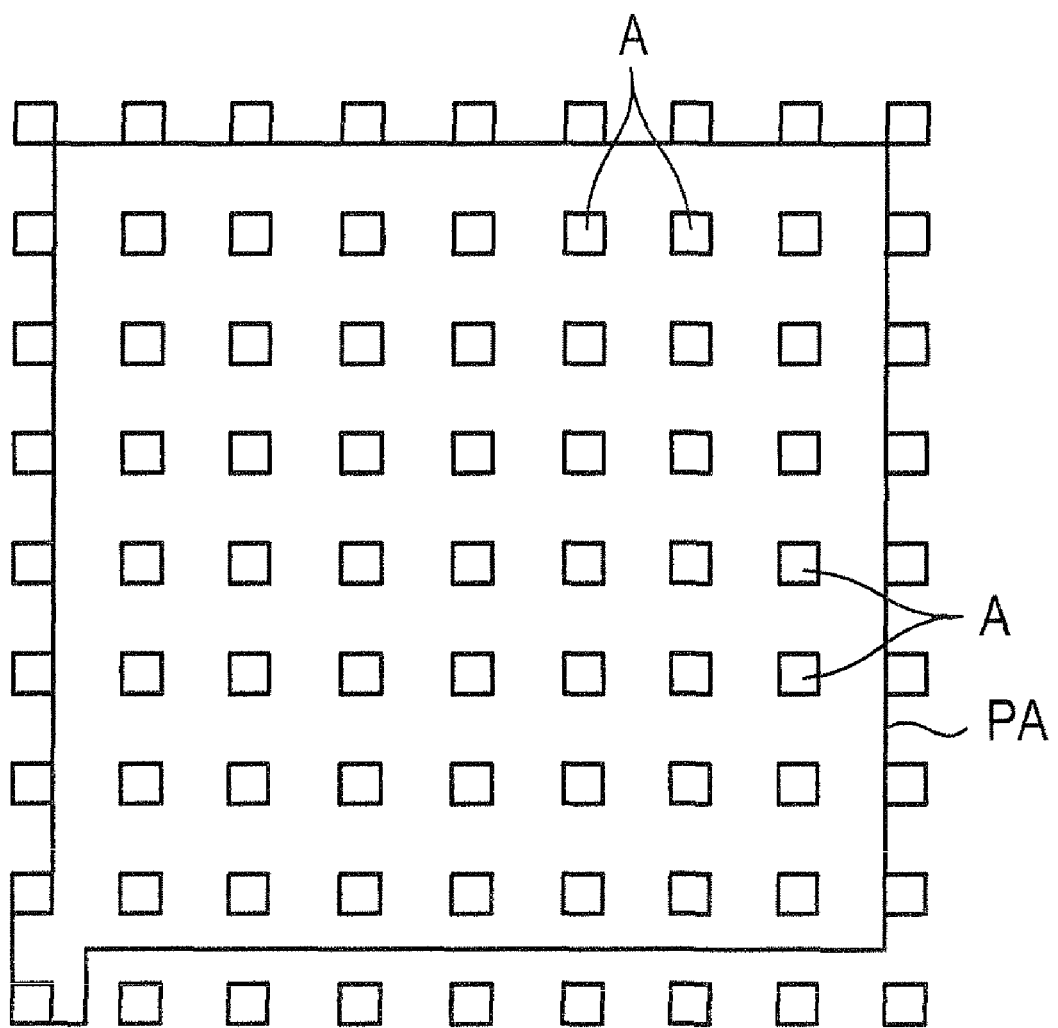
FIG. 17 is an explanatory diagram illustrating a method for laying rectangular patterns A.
Figure 18:
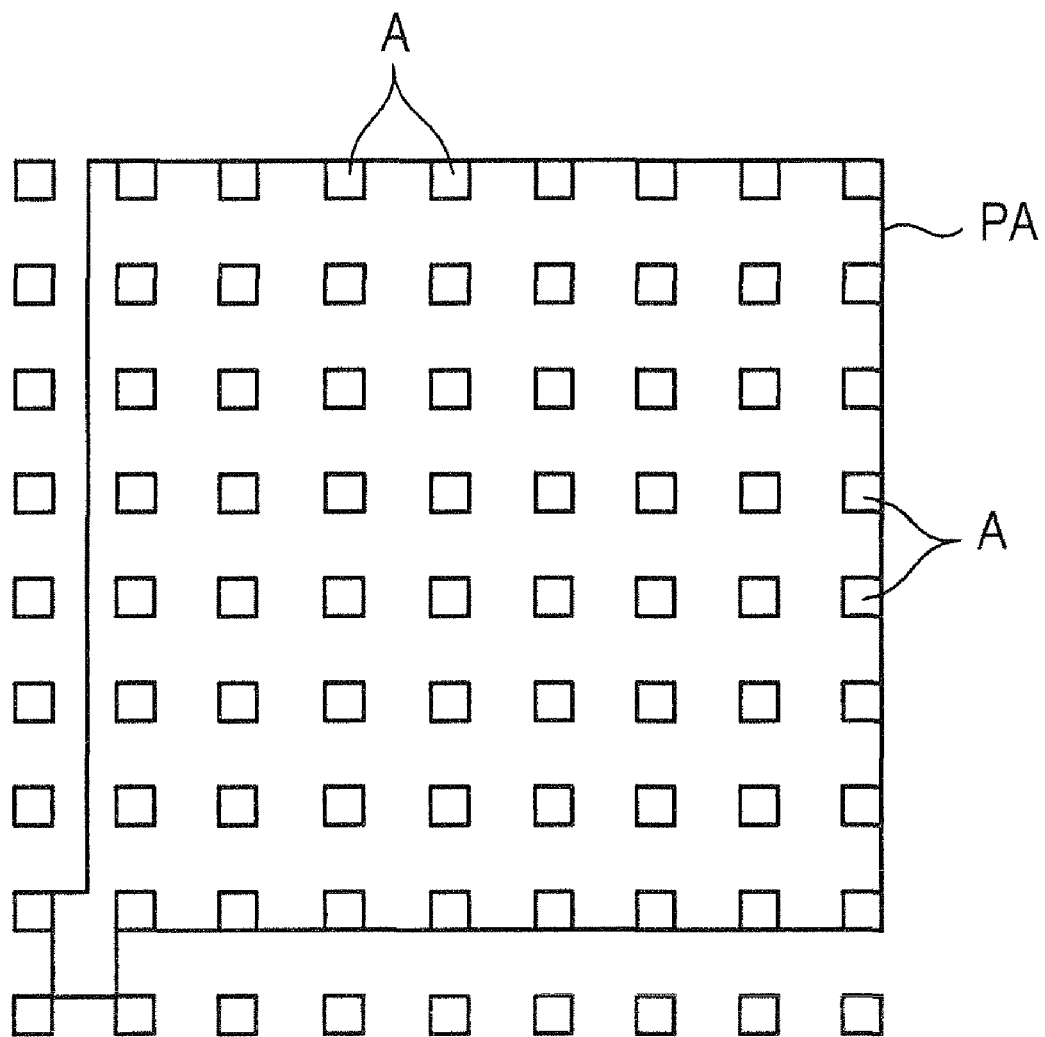
FIG. 18 is an explanatory diagram illustrating a method for laying rectangular patterns A.

FIGS. 17 and 18 show other examples of methods for laying the rectangular patterns A. If the largest possible number of rectangular patterns A are laid on an object pattern PA, the region that can be exposed by reticle exposure may be expanded. If the reticle exposure region is expanded, the throughput of hybrid exposure can be improved.

Specifically, compared with the case wherein rectangular patterns A are laid so as not to contact the contour lines of the object pattern PA as shown in FIG. 17, if rectangular patterns A are laid so as to contact the inside of the contour lines of the object pattern PA as shown in FIG. 18, the number of rectangular patterns A that can be laid on the object pattern PA can be increased.

Therefore, by laying a larger number of rectangular patterns A in the object pattern PA, the number of rectangular patterns B in the object pattern PA can be increased, and in turn, by increasing the number of rectangular patterns B the reticle exposure region can be enlarged.

FIG. 19 shows the case where object pattern PA are laid out by the contour line diagonal to the X-axis and the Y-axis.

Figure 19A:
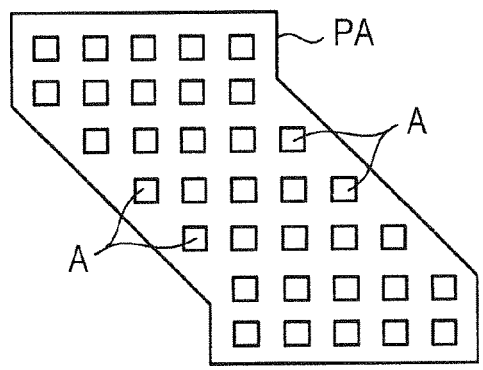
FIGS. 19A to 19E are explanatory diagrams illustrating methods for preparing exposure data at the oblique side of object patterns.
Figure 19B:
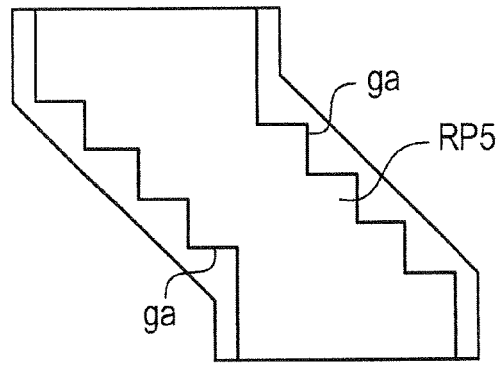

As shown in FIG. 19A, when rectangular patterns A are laid on an object pattern PA in the diagonal direction, and the treatment as described above to form a reticle exposure pattern is performed, as shown in FIG. 19B, the contour line of the formed reticle exposure pattern RP5 becomes stair-like steps ga. Then, the length of a side of the steps ga is the sum of the size of the rectangular patterns A and the disposing distance da. The steps ga may become a simulated error in the reticle test.

Figure 19C:
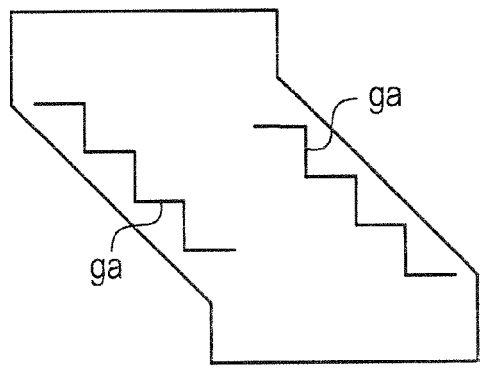
Figure 19D:
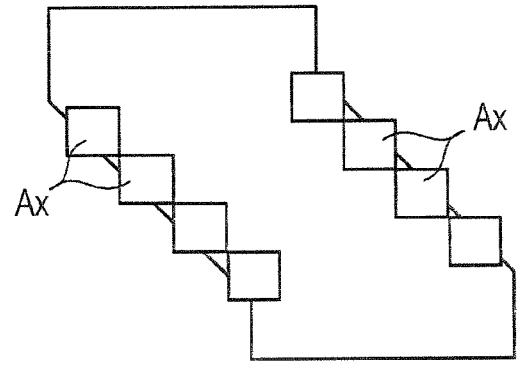
Figure 19E:
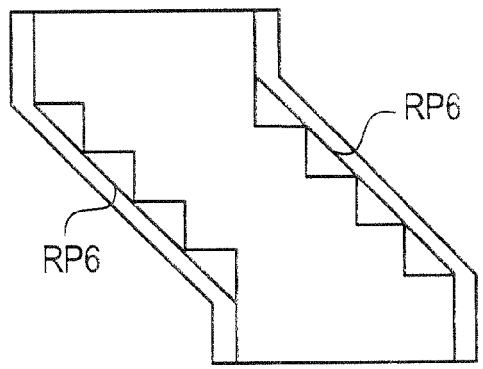

In such a case, as shown in FIG. 19C, steps ga are extracted, and as shown in FIG. 19D, rectangular patterns Ax a side of which equals a step ga are inserted in each step ga. Then, as shown in FIG. 19E, the diagonal of the rectangular patterns Ax that overlaps the contour line of the object pattern PA is made to be the contour line of the reticle exposure pattern, and combined with the reticle exposure pattern RP5 to form the reticle exposure pattern RP 6.

By providing such treatments, simulated errors in the reticle test can be prevented, and the reticle exposure region can be widened.

According to aspects of the method for preparing data for exposure as described above, the following effects can be obtained.

(1) The object pattern PA can be lined with rectangular patterns A formed by the reticle preparation rule; rectangular patterns B can be formed from the rectangular patterns A; the pattern width and the pattern distance of the reticle exposure pattern can be verified from the center location of the rectangular patterns B; and violation sites can be corrected. Therefore, since the verification of the pattern width and the pattern distance using the coordinate of the object pattern PA is not required, the verifying process can be easily conducted.

(2) The size s and the disposing distance da of the rectangular patterns A can be easily calculated from the minimum pattern width w and the minimum pattern step g in the reticle preparation rule.

(3) The number N of the rectangular patterns A disposed on the sides of the rectangular patterns B can be easily calculated from the minimum pattern width w and the minimum pattern step g in the reticle preparation rule.

(4) The sites that violate the minimum pattern width w and the minimum pattern distance d can be easily detected on the basis of the center location of the rectangular patterns B.

(5) By deleting rectangular patterns A in the sites that violate the minimum pattern width w and the minimum pattern distance d to reform the rectangular patterns B, and detecting whether the sites that violate the minimum pattern width w and the minimum pattern distance d are present or not, on the basis of the distance between the center locations of the reformed rectangular patterns B, the correcting treatment of the violation sites can be easily performed.

(6) Whether a violation of the minimum pattern width w is present or not can be detected by calculating whether or not the value |X1−X2| is the minimum pattern width w or less; and whether or not the value |Y1−Y2| is the minimum pattern width w or less; on the basis of the X-Y coordinate of the center of the rectangular patterns B.

(7) Whether a violation of the minimum pattern distance d is present or not can be detected by calculating whether or not the value |X1−X2|−w is the minimum pattern distance d or less; and whether or not the value |Y1−Y2|−w is the minimum pattern distance d or less; on the basis of the X-Y coordinate of the center of the rectangular patterns B.

(8) When a hypotenuse is present in the object pattern PA, rectangular patterns Ax can be inserted in the stair-like step ga formed as the reticle exposure patterns, and the diagonals of the rectangular patterns Ax can be used as the reticle exposure patterns. Therefore, simulated error in the reticle test can be prevented, and the reticle exposure region can be widened.

Figure 16B:
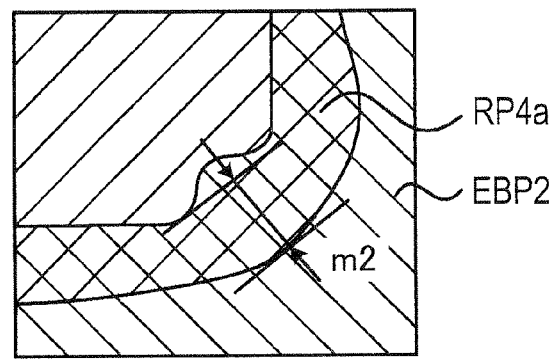

The above-described embodiment in accordance with aspects of the present invention can also be executed in the aspect described below. Rectangular locations can be set up by grids (points) in place of the rectangular patterns A. In this case, the distance between grids can be set up to be the minimum step g in the reticle preparation rule. In the process shown in FIG. 16, although rectangular portions Y having a height of α are formed on the corner portions in the concave direction of the EB exposure pattern EBP1, stair-shape other than rectangular, or triangular patterns can also be formed.

Although the embodiment is described as a method for preparing reticle exposure pattern data, the method can be conducted as a method for preparing pattern data of the mask used in the exposure process, and the mask pattern can be formed on the mask substrate.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention(s) has(have) been described in detail, it should be understood that the various changes, substitutions, and alterations could be made hereto without departing from the spirit and scope of the invention.

What is claimed is:

1. A method for preparing data for exposure for manufacturing photo masks of a semi-conductor integrated circuit, comprising:

forming a first plurality of rectangular patterns from a reticle preparing rule;

lining an object pattern for performing reticle exposure with the first plurality of rectangular patterns, and extracting a second plurality of rectangular patterns disposed in an N×N matrix, from the first rectangular patterns in the object pattern; and performing a violation detecting treatment and a correcting treatment of the pattern width and the pattern distance of the reticle exposure pattern on the basis of the distance between the center coordinates of the second plurality of rectangular patterns.

2. The method according to claim 1, wherein the correcting treatment includes removing any of the first plurality of rectangular patterns that are determined to be violation sites in the violation detecting treatment.

3. The method according to claim 2, further comprising a step of;

integrating the second plurality of rectangular patterns after the correcting treatment to form a reticle exposure pattern.

4. The method according to claim 1, wherein the size and the disposing distance of the first plurality of rectangular patterns are calculated from a minimum pattern width and a minimum pattern step of the reticle forming rule.

5. The method according to claim 1, wherein the number N of the first plurality of rectangular patterns disposed on each side of the second rectangular patterns is calculated from a minimum pattern width and a minimum pattern step of the reticle forming rule.

6. The method according to claim 1, wherein the violation detecting treatment for pattern width on the basis of the distance between the center coordinates of the second plurality of rectangular patterns includes detecting whether the distance of the X-coordinate and the distance of the Y-coordinate of each center is more than a minimum pattern width determined by the reticle preparing rule on the basis of the X-Y coordinate of the centers of two of the second plurality of rectangular patterns.

7. The method according to claim 1, wherein
the violation detecting treatment for pattern distance on the basis of the distance between the center coordinates of the second plurality of rectangular patterns includes detecting whether both the values obtained by deducting a minimum pattern width determined by the reticle preparing rule from the distance of the X-coordinate of each center, and obtained by deducting the minimum pattern width from the distance of the Y-coordinate of each center are less than a minimum pattern distance determined on the basis of the X-Y coordinate of the centers of two of the second plurality of rectangular patterns.

8. The method according to claim 1, wherein
a plurality of rectangular patterns, one of whose side has a height equal to the height of a step, are inserted into a stair-like step of the reticle exposure pattern, and the diagonal of the rectangular pattern is extracted to be a reticle exposure pattern.

9. A method for manufacturing a photo mask comprising:
forming a first plurality of rectangular patterns from a mask preparing rule;
lining an object pattern for performing mask exposure with the first plurality of rectangular patterns, and extracting a second plurality of rectangular patterns, disposed in an N×N matrix, from the first plurality of rectangular patterns in the object pattern;
performing a violation detecting treatment and a correcting treatment of a pattern width and a pattern distance of the mask pattern on the basis of the distance between the center coordinates of the second plurality of rectangular patterns; and
placing the mask pattern, after the correcting treatment, on a mask substrate.

* * * * *